United States Patent [19]

Winebarger

[11] 4,260,907
[45] Apr. 7, 1981

[54] POWER-ON-RESET CIRCUIT WITH POWER FAIL DETECTION

[75] Inventor: Joseph P. Winebarger, Knightdale, N.C.

[73] Assignee: Telex Computer Products, Inc., Raleigh, N.C.

[21] Appl. No.: 47,898

[22] Filed: Jun. 12, 1979

[51] Int. Cl.³ .................. H03K 5/01; H03K 21/32
[52] U.S. Cl. ............................ 307/264; 307/268; 307/297; 307/358; 328/48
[58] Field of Search ............... 307/296, 297, 268, 358, 307/363, 229, 30; 328/48

[56] References Cited

U.S. PATENT DOCUMENTS

| | | | |
|---|---|---|---|
| 3,808,466 | 4/1974 | Campbell | 307/358 |
| 3,895,239 | 7/1975 | Alaspa | 307/268 |
| 3,950,654 | 4/1976 | Broedner et al. | 307/297 |

Primary Examiner—Stanley D. Miller, Jr.
Assistant Examiner—B. P. Davis
Attorney, Agent, or Firm—Head & Johnson

[57] ABSTRACT

A power-on-reset circuit with power fail detection, comprises a supply voltage V, and a voltage divider comprising two series resistors connected between V and the ground. The junction between the two resistors is connected to the (+) terminal of a voltage comparator. The junction is also connected through a diode to the (−) terminal of the comparator. The (−) terminal is also connected to ground through a capacitor and resistor in parallel. A resistor and compacitor in series are connected between V and ground and the junction between the resistor and the capacitor is connected to the output of the comparator, and also to the input of an inverting gate. The output of the inverting gate is the power-on-reset terminal.

3 Claims, 3 Drawing Figures

POWER-ON-RESET CIRCUIT WITH POWER FAIL DETECTION

BACKGROUND OF THE INVENTION

1. Field of the Invention

This invention lies in the field of electronic equipment. More particularly it is concerned with the problems which arise in the use of electronic equipment when the power supply to the equipment fails for very short, or long times.

In most electronic equipment there are one or many latches, flip flops, adders, registers, counters, etc. When the power supply voltage drops to a very low value, or zero, the operation of the electronic circuit stops. When this happens, the actual condition of each of the elements of the electronic circuit is not known. The general manner in which the equipment is started up again, when the power does resume, is to reset all of the electronic components which are resettable, when this is done it is known exactly what the circuit condition is. Therefore, it is important when a power supply voltage outage occurs, to know first, whether the power has dropped to such a low value that the electronic devices such as gates, and comparators lose control, or whether the voltage has remained above that known minimum voltage. If the voltage remains above that value, it is not necessary to reset the equipment. If the voltage drops below that value then it is imperative to reset the equipment.

Of course, when the voltage outage is long, such as several seconds or more, there is no question but that the power-on-reset is necessary. However, when the outage may be as short at 10 or 15 milli-seconds, there is no way of telling whether the reset is necessary unless the power-on-reset circuit is designed to determine whether reset is necessary.

2. Description of the Prior Art

Many circuits have been devised for the purpose of producing a power-on-reset (POR) voltage to reset the electronic elements. In most cases such POR circuits comprise simply a series resistor and capacitor between the supply voltage V and ground. The junction between the two elements is carried to an inverting gate and the output of the gate becomes the POR voltage terminal.

In general where the power outage is of a substantial period of time, this simple circuit works fine, however for very short voltage outages there are problems which concern the rate at which voltage at the junction between the resistor and capacitor fall towards zero, in relation to the rate at which the voltage V falls towards zero. In most cases the power supply voltage has capacitance in an output filter, which causes the voltage to decrease at another rate than an instantaneous drop to zero. Of course, for very short time outages, if the voltage comes to the power supply quickly enough, the voltage then will start building up rapidly and the need for a reset voltage is absent.

Therefore, for the cases where the power outages are short-time, it becomes necessary to have an apparatus which can be designed or modified externally, to alter the time-constant of critical parts of the circuit so that it will positively identify when the power voltage drops below the selected minimum. In that case it produces a power-on-reset voltage, which remains on until the power has come back on and reached a selected magnitude. The POR voltage is then cut off, and the equipment proceeds in its proper manner starting from a known condition of reset.

SUMMARY OF THE INVENTION

It is the primary object of this invention to provide a simple low drain circuit for monitoring the value of the power supply voltage, and when this voltage becomes less than a selected value to provide a continuing POR signal until the power supply voltage V again rises to a second selected magnitude.

It is a further object of this invention to provide the POR signal only in the event that the power supply voltage has dropped below a first selected value of voltage.

These and other objects are realized, and the limitations of the prior art are overcome in this invention, by providing a two-part circuit. A first part uses a comparator and determines when the supply voltage has fallen below a first selected value. In that case the comparator controls a second stage, wherein the POR voltage is generated. The POR voltage is maintained until the power supply voltage again reaches a value of voltage higher than a second selected value.

The supply voltage V, has a voltage divided, comprising a first and second resistor in series, to ground. The junction between the two resistors is connected to the (+) terminal of an open collector comparator. The junction between the two resistors is connected through a diode to the (−) terminal of the comparator. This (−) terminal is further connected to ground through a resistor and capacitor in parallel.

When the (+) terminal is higher than the (−) terminal, the output terminal of the comparator becomes high, and is connected to an inverter gate so that the output of the inverter gate becomes low. This is the condition when the power supply voltage is high.

The (−) terminal of the comparator is connected to ground through a capacitor and resistor in parallel. The capacitor and resistor form a long time-constant circuit. Thus, when the voltage V drops, the potential of the junction will drop, and the voltage on the (−) terminal stays substantially constant, at least for short periods of time. As the power supply voltage drops, the potential on the (+) terminal of the comparator will eventually drop below the potential of the (−) terminal. Then the output terminal of the comparator goes low, and thus the output of the inverting gate goes high. This puts potential on the reset terminals so that they will be reset. The POR voltage remains high until again the power supply voltage V rises, and the voltage of the junction rises to a second selected voltage, at which time the POR signal is removed. The electronic equipment, then starting from a known condition of reset, proceeds to operate in a proper manner.

BRIEF DESCRIPTION OF THE DRAWINGS

These and other objects and advantages of this invention and a better understanding of the principles and details of the invention, will be evident from the following description taken in conjunction with the appended drawings, in which.

DESCRIPTION OF THE PREFERRED EMBODIMENT

Figure 1:
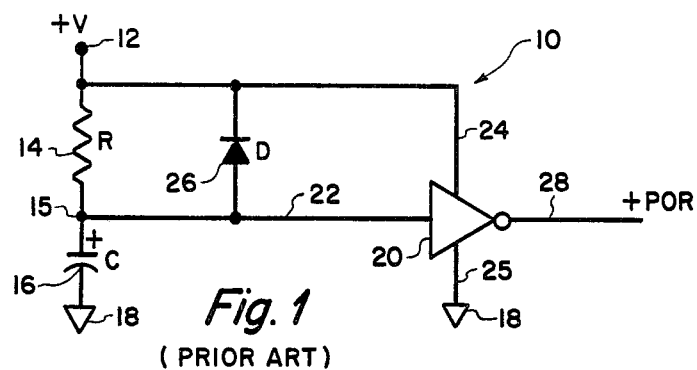
FIG. 1 illustrates a prior art POR circuit.

Referring now to the drawings, and in particular FIG. 1, there is shown a prior art circuit designed to provide a power-on-reset voltage, whenever the power supply voltage V drops below a selected value of voltage. A series resistor R, 14, and capacitor C, 16, are connected between the terminal 12 of the power supply voltage V, and ground 18. The junction 15 between the two elements 14 and 16 is connected to an inverting gate 20. When the voltage on the input on line 22, to the inverting gate 20, is higher than a selected minimum voltage, about 0.8 volts, the output of the inverting gate 20 on line 28 will be low, and there will be no reset voltage available. However, when the power supply voltage goes out, the potential of terminal 12 will drop toward zero along a curve of voltage as a function of time, which is characteristic of the particular power supply.

Consider the case where the power supply voltage V has been out for a long while. V is zero, and voltage of C is zero. When the power supply comes back on, voltage V builds up, again along a curve different for each power supply. When V gets high enough to activate inverter 20, if the input on 22 is less than about 0.8 volts, the output on 28 will be high. This is what is required.

So it is necessary to delay the rise of voltage on C behind that on V. This is done by making the time constant of R, C long. What is needed is to make the voltage on 22 stay below 0.8 until V has reached a voltage greater than 4.75, at which time the logic elements become operative. All this time the POR is on. After V reaches 4.75 volts the POR can be removed, and this happens when voltage on 22 gets above 0.8 volts, the input on 20 goes high, and the output on 28 goes low.

What happens when the V drops for a very short time interval. Of course, the voltage V does not drop instantly, but falls off along a curve, different for each power supply. So long as V is above 4.75 no POR is required. But if V goes below 4.75 volts, a POR signal is desirable. But with the circuit of FIG. 1 a POR signal will not be generated until the voltage on C reaches approximately 0.8 volts. This will not occur until voltage V has reached almost zero volts. (The diode 26 is forward biased as V falls below the voltage on C and provides a discharge path for C.) Therefore this circuit will not provide a POR if V drops below 4.75 without decaying to zero volts. Zero volts will vary depending on the power supply characteristics.

Any power outage that falls in the time window (voltage is less than 4.75 V but greater than 0V) will fail to generate a POR and will result in improper operation of the system, so that the simple circuit of FIG. 1 is not always satisfactory.

Figure 2:
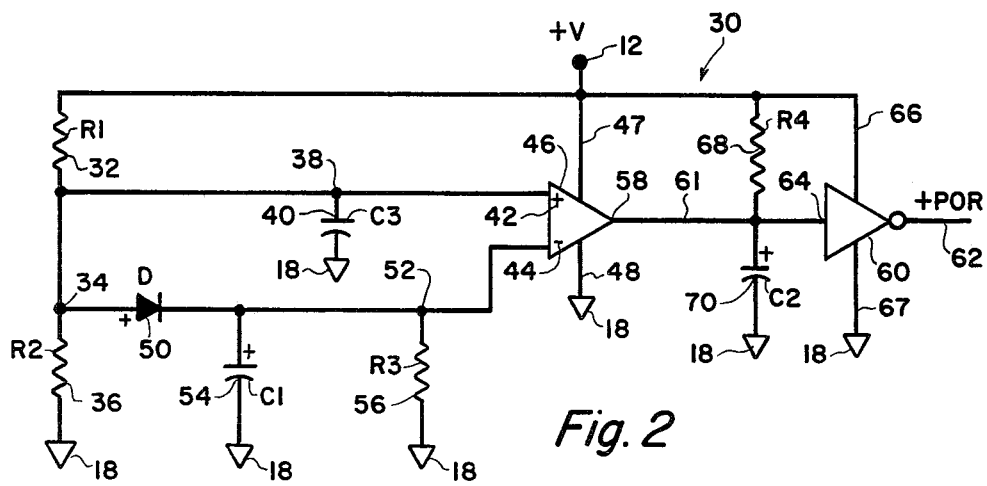
FIG. 2 illustrates one embodiment of an improved POR circuit, with power fail detection.

Referring now to FIG. 2, there is a preferred embodiment of this invention, which involves a circuit which includes substantially the prior art circuit of FIG. 1, but has an additional voltage comparator, or voltage measuring circuit, that can determine if and when the power supply voltage drops below a selected minimum. In that case the comparator suddenly switches from a high output to a low output and thus controls the output stage of the device to produce a POR output.

The terminal 12 carries the output voltage V of the power supply. There is a voltage divider connected between terminal 12 and ground 18, which comprises a first resistor R1, 32 and a second resistor R2, 36 in series, having a junction 34. An open collector comparator 46 has its (+) terminal 42 connected to the junction 34. The negative (−) terminal, or reference terminal, 44 of the comparator is also connected to the junction 34 through a diode 50 having its (+) terminal at the junction 34.

A parallel capacitor C1, 54 and resistor R3, 56 are connected between the (−) terminal 44 and ground. These serve to provide a long time-constant circuit, which is at a potential sightly less than that of the junction 34 by the voltage drop through the diode 50.

When the potential of the terminal 12 drops due to an outage of the power supply, the voltage of the junction 34 being a substantially fixed fraction of the voltage V, drops also, in a similar manner. Because of the long time-constant capacitor C1 and resistor R3, the voltage at 52 on the (−) terminal 44 of the comparator remains substantially constant, at the reference voltage, while the (+) terminal 42 of the comparator drops in accordance with the potential of the junction 34.

Since the voltage divider R1, R2 has no storage, the potential 42 drops in accordance with the decay of the voltage V. When the potential on the (+) terminal 42 reaches the potential on the (−), or reference terminal 44, the comparator changes from having a high output on the output terminal 58, to a low voltage on the output terminal 58.

The comparator thus acts as a switch, which suddenly changes from one condition to another, when the potential on its (+) terminal ceases to be sufficiently high compared to the (−) terminal or reference terminal input. Thus, as a detector of voltage of the power supply terminal 12, and by choice of the voltage ratio across the resistor R1 and R2, the comparator switching means can be set to switch the POR voltage when the power supply voltage reaches any selected minimum voltage.

The second stage of the circuit of FIG. 2 is similar to that of FIG. 1, and comprises an inverter gate 60 with its input 64 connected to the output 58 of the comparator by line 61. The potential of line 61 is tied by a resistor R4, 68 to terminal 12, and also through capacitor C2, 70 to ground 18.

The time-constant of the combination R4, C2 is such that the voltage on line 61 will build up at a rate according to the time-constant of R4, C2, which should be slightly slower than the rate at which the voltage builds up in the power supply. Thus the high output on the POR terminal 62 will remain until the voltage V has returned to a second selected voltage, which is higher than the first selected voltage, which is the voltage below which the POR signal must be present.

Many of the outages of the power supply may occur from very short time transients, due to lightning on the power lines, or various switching transients, and so on. Some of these can be of very short time duration, and because of the slow decay of the power supply output itself, do not endanger the operation of the equipment.

These minor voltage variations can be filtered out by the small capacitor C3, 40, tied to ground on one side and to the junction 34 through the lead 38. This small capacitor and the small resistor R2, 36, in parallel with R1, 32, have a very short time-constant, which is shorter than the decay of the voltage supply V, so that they do not prevent the comparator from following closely the voltage V.

Figure 3:
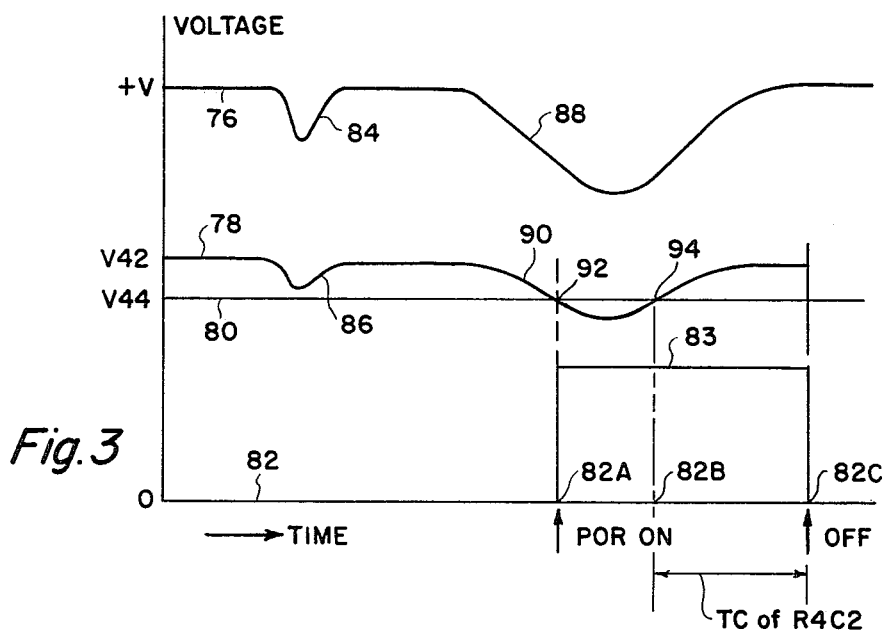
FIG. 3 illustrates the changing voltage condition in the apparatus of FIG. 2, as a function of time, for different voltage outages.

Referring now to FIG. 3 there is shown a first curve 76, which starts at an ordinate value of +V, which is the normal power supply voltage. There is a second curve 78, which starts at a voltage V42 which is the potential on the plus terminal of the comparator, and which is substantially the voltage of the junction 34. Another curve 80, starts at a voltage V44, which is the potential on the (−) terminal on the comparator, and which, for all practical purposes, for short time transients is substantially constant and is a horizontal line 80. Zero voltage is represented by the line 82. Time runs to the right.

On curve 76 is shown a small transient drop in voltage 84 which might be a very small transient of very short time duration. The potential at the junction 34, and therefore on the comparator (+) terminal 42 is shown by the dip 86 on curve 78. This might, for example, be roughly half the drop 84, if the resistors R1 and R2 are substantially equal. If the drop in potential 86 is such that the potential V42 is still above the potential V44, then nothing happens. However, later there is a longer transient voltage drop indicated by the numeral 88. This is a longer time transient and therefore drops to a lower potential than the transient 84.

Similarly, the transient 90 in the voltage V42 will follow that of V88. When the voltage 90 crosses the reference voltage 80 at point 92, then the comparator switches dropping its output at 58 to a low signal. This causes the output on line 62 of the inverter 60, to go high, and the reset voltage then is applied to the equipment. This point is marked by 82A, as being the time when POR signal goes on. This stays on, as shown by the line 83, until a later time 82C, when it switches off after the voltage on 42, according to curve 78, again returns to its proper value, which is a second selected value of voltage at point 94, plus the R4 C2 time constant.

What has been described is a POR circuit that not only provides a reset voltage to be applied to certain electronic equipment during power outages, but it has a potential detector such that the POR signal only comes on when the power supply voltage drops below a selected minimum voltage. This POR signal then stays on and is controlled by the time-constant of a second stage of the equipment, until the power supply potential has reached a second selected value.

While the invention has been described with a certain degree of particularity, it is manifest that many changes may be made in the details of construction and the arrangement of components. It is understood that the invention is not to be limited to the specific language used, or the specific embodiments set forth herein by way of exemplifying the invention, but the invention is to be limited only by the scope of the attached claim or claims, including the full range of equivalency to which each element or step thereof is entitled.

What is claimed is:

1. A power-on-reset circuit with power fail detection, comprising;
    (a) a power supply terminal having voltage V;
    (b) a first resistor R1 connected at one terminal to V, and the other terminal to a second resistor R2, the second terminal of R2 connected to ground; the potential of the junction between R1 and R2 a selected fraction of V;
    (c) a voltage comparator having an open collector, with its power supply connected to V; the (+) input terminal connected to said junction; the (−) input terminal connected to ground through a first capacitor C1 and a third resistor R3 in parallel; a diode D connected from said junction to said (+) input;
    (d) the output terminal of said comparator connected to V through a fourth resistor R4 and to ground through a second capacitor C2;
    (e) an inverting gate with its input connected to said comparator output terminal;
    (f) the output of said inverting gate comprising said power-on-reset terminal.

2. The circuit as in claim 1 in which the time-constant of C1, R3 is long compared to the short time power outages.

3. The circuit as in claim 1 and including a third capacitor C3 connected from said junction to ground, the capacitance of C3 being such that the time-constant of C3 (R2 in parallel with R1) is smaller than that of C1, R3.

* * * * *